United States Patent [19]
Below et al.

[11] Patent Number: 5,139,445
[45] Date of Patent: Aug. 18, 1992

[54] MODULAR TEST ADAPTER

[75] Inventors: Randall J. Below, Woodbury; John A. Siemon, Watertown, both of Conn.

[73] Assignee: The Siemon Company, Watertown, Conn.

[21] Appl. No.: 624,143

[22] Filed: Dec. 7, 1990

[51] Int. Cl.[5] .............................................. H01R 23/02
[52] U.S. Cl. .................................... 439/676; 439/650; 439/712; 439/912
[58] Field of Search .................................. 439/638–640, 439/651–655, 912, 676, 502–505, 709, 712

[56] References Cited

U.S. PATENT DOCUMENTS

| | | | |
|---|---|---|---|
| 4,303,296 | 12/1981 | Spaulding | 439/638 |
| 4,392,701 | 7/1983 | Weidler | 439/638 |
| 4,493,951 | 1/1985 | Sanderson et al. | 439/912 |
| 4,585,290 | 4/1986 | Knickerbocker et al. | 439/651 |
| 4,620,765 | 11/1986 | Knickerbocker | |
| 4,944,698 | 7/1990 | Siemon et al. | 439/638 |

OTHER PUBLICATIONS

New Product Info: "In-Line Modular Adapter, Harris Dracon Division" 1985.

*Primary Examiner*—David L. Pirlot
*Attorney, Agent, or Firm*—Fishman, Dionne & Cantor

[57] ABSTRACT

A modular test adapter includes a housing, a pair of modular telecommunications jacks mounted with the housing and eight electrically continuous test circuits connecting the jacks. Each test circuit provides an electrical connection between one of the wire termination pins on one of the jacks with a corresponding pin on the other jack. A third electrical access is provided on each circuit by means of an electrical contact pad. The housing defines openings in a pair of parallel sides for providing access to the plug openings of the jacks and defines radially oriented spaced apart recesses along curved end surfaces on the housing for providing access to the contact pads. The adapter includes a detachable plug cord that also functions as a carrying strap for the adapter.

12 Claims, 4 Drawing Sheets

MODULAR TEST ADAPTER

TECHNICAL FIELD

This invention relates to telecommunications devices and more particularly to a modular test adapter for telecommunications circuits.

BACKGROUND OF THE INVENTION

In the telecommunication arts there frequently arises the need to test telecommunications wiring, e.g. during installation and repair of such wiring. Coassigned U.S. Pat. No. 4,620,765, the disclosure of which is incorporated herein by reference, is directed to a modular test adapter for testing telecommunications wiring. The modular test adapter of the '765 patent includes an octagonally shaped electrically insulating housing securing eight electrical contacts therein and an eight conductor jacketed cable which interconnects the contacts and a modular plug.

At least one commercially available in-line modular adapter includes a modular jack in electrical connection with a single ended plug cord. The conductors from the cable and the jack are electrically bridged with circuit access pads and the jack and access pads are housed in a generally rectangular shaped housing. Each access pad terminates two wires, i.e. one wire from the jack and one wire from the plug cord internal to the housing and includes a portion which extends from the housing for access by testing hardware. The device is available in 4, 6 and 8 wire configurations.

The above discussed devices are encumbered with limitations with regard to ease of use and to manufacturability which is discussed in detail below.

SUMMARY OF THE INVENTION

A modular test adapter is disclosed. The adapter includes a pair of modular communications jacks. Each of the jacks includes a plurality of resilient wire contacts and has a plug opening for receiving a modular telecommunications plug. The adapter includes a plurality of electrically isolated test circuits. Each circuit comprises an electrical contact pad in electrical connection with one of the pins of each of the jacks. Housing means are provided for securing the jacks and the contact pads in a fixed relative spatial arrangement for electrically isolating each of the pads and for covering said test circuits while allowing access to said plug openings and contact pads. Each test circuit of the adapter of the present invention provides three distinct connection points. The adapter of the present invention provides terminal or in-line access to up to eight circuits of a telecommunication network.

In a preferred embodiment, a detachable double ended plug cord having a universal plug on each end is connected to one of the jacks to provide access to standard 2, 4, 6 or 8 position modular jacks.

DETAILED DESCRIPTION OF THE INVENTION

Figure 1:
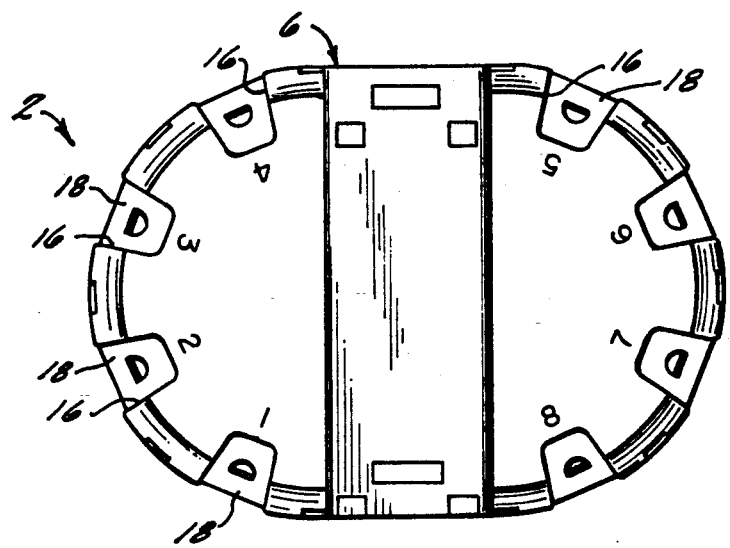
FIG. 1 shows a top view of one embodiment of the adapter of the present invention.
Figure 2:
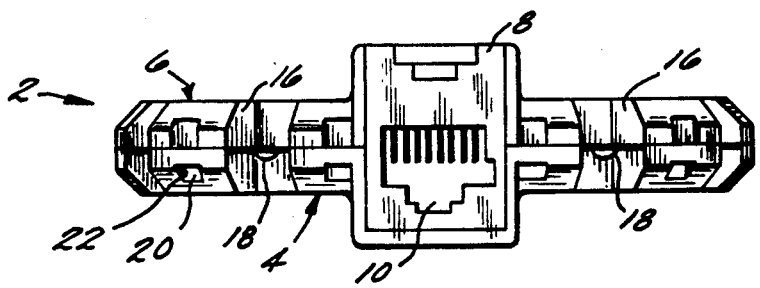
FIG. 2 shows a front elevational view of the adapter of FIG. 1.
Figure 3:
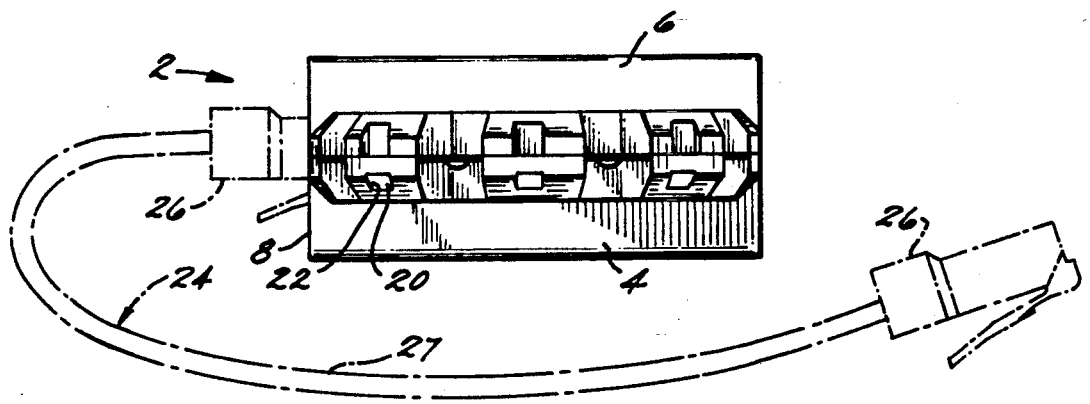
FIG. 3 shows a side elevational view of the adapter of the present invention with detachable plug cord.

FIGS. 1, 2 and 3 show top, front elevational and side elevational views, respectively, of the adapter of the present invention. The adapter includes an electrically insulative housing 2. The housing 2 includes a bottom half 4 and a top half 6. A first modular communication jack 8 is secured within the housing 2 and provides a plug opening 10 for receiving a modular telecommunications plug. A second oppositely oriented modular telecommunications jack 12 (shown in FIG. 6) is also provided. The housing 2 defines a plurality of recesses 16. An electrical contact pad 18 is provided within each recess 16 to provide contact areas for connecting with a testing device. The bottom half 4 and top half 6 are secured together by snap locking engagement of tabs 20 and recesses 22 (shown more clearly in FIGS. 5 and 10) to form the housing 2.

FIG. 3 shows a side elevational view of the adapter 2 wherein the adapter 2 is connected to a double ended plug cord 24. The plug cord 24 includes a pair of "universal" modular plugs 26 electrically connected by a cable 27.

The plugs 26 are of the type described in the above cited U.S. Pat. No. 4,620,765 and allow access to standard 2, 4, 6 and 8 position jack connectors without requiring additional adapters or wiring hardware. The plug cord/test adapter assembly may be connected to any network access point having plug and jack connectors for use as an in-line test adapter.

The detachable plug cord 24 prolongs the service life of the adapter by isolating the jack connectors 8, 12 from repeated mating and unmating cycles. If the plug connectors 26 of the plug cord 24 become worn or damaged, the plug cord 24 may be replaced at a fraction of the replacement cost of the test adapter.

When the test adapter is not in use, each of the connectors 26 may be plugged into opposed jacks 8, 12 to form a closed loop so that the plug cord 24 functions as a carrying strap, e.g. for attaching the test adapter to a user's clothing.

Figure 4:
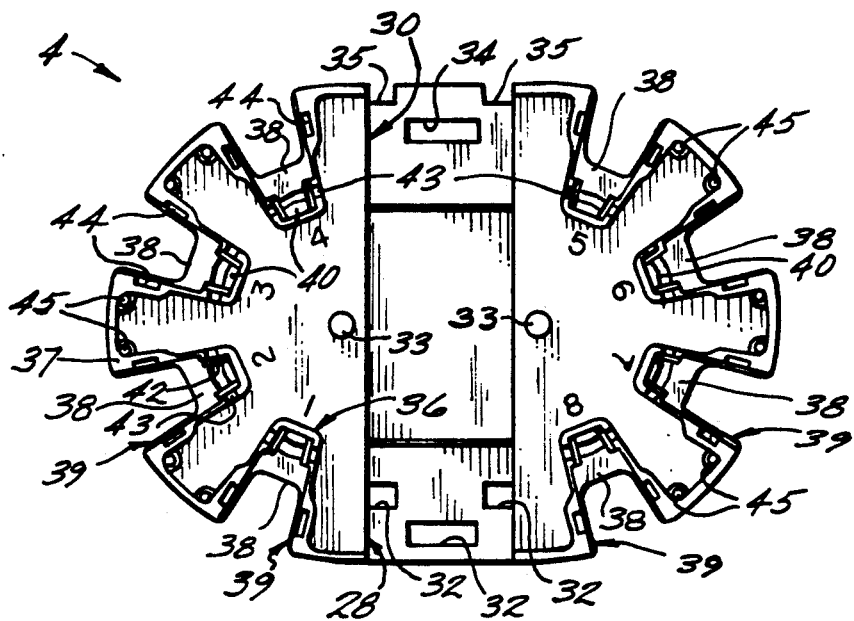
FIG. 4 shows a top view of the bottom half of the housing of the adapter assembly of FIG. 1.
Figure 5:
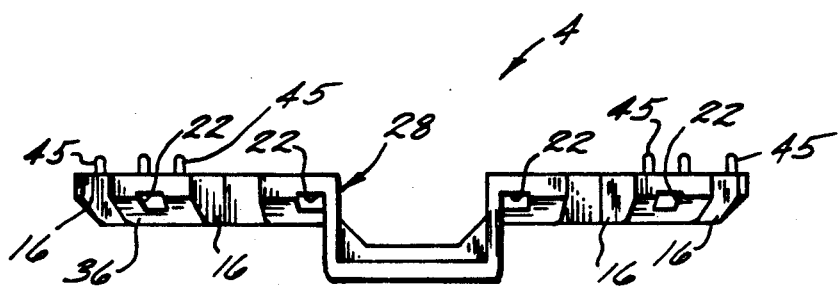
FIG. 5 shows a front elevational view of the housing shown in FIG. 4.

FIGS. 4 and 5 show views of the bottom half 4 of housing 2. The bottom half 4 of the housing 2 provides recesses 28 and 30 for receiving modular telecommunications jacks 8 and 12 respectively and slots 32, 34 and notches 35 for securing jacks 8 and 12 within the respective recesses 28 and 30.

The bottom half 4 includes a bottom wall 35 and a side wall 36 which extends upwardly to a top edge 37 and which defines the perimeter of the bottom half 4. A pair of pins 33 project upwardly from the bottom wall 35. Circumferentially spaced apart recessed areas 39 are defined along the side wall 36. Contact pad relief surfaces 38 parallel to and slightly spaced back from the top edge 37 are associated with each recessed area 39. Each relief surface 38 is interrupted by wire channel 40.

Contact pad retaining slots 42, 44 are formed in the relief surface 38. Wire strain relief slots 43 are formed in the wall 36 in alignment with wire channel 40 adjacent to pad retaining slot 42. A plurality of pins 45 are provided for aligning the top 6 and the bottom 4 halves of housing 2.

Figure 6:
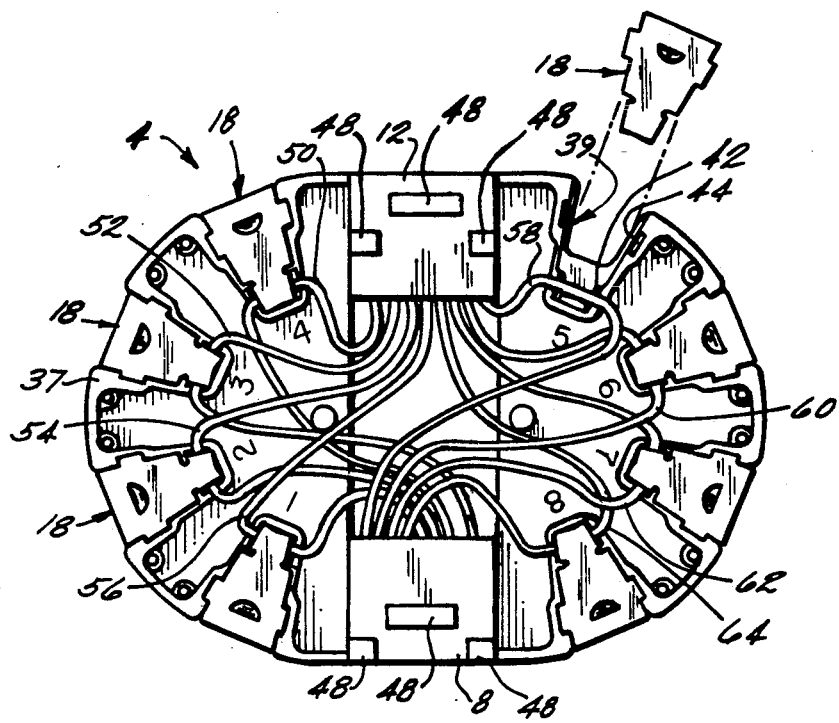
FIG. 6 shows a partially exploded top view of the bottom half of the adapter assembly of FIG. 1.
Figure 8:
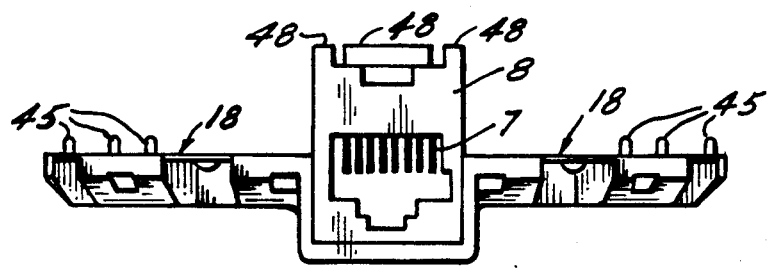
FIG. 8 shows a front elevational view of the assembly of FIG. 6.

FIGS. 6 and 8 show views of the bottom half of the adapter assembly. Conventional modular telecommunications jacks 8 and 12 are received in recesses 28 and 30, respectively. Jacks 8 and 12 each include mounting tabs 48 for interlocking with retaining slots 32 and 34 and retaining notches 35 on the bottom and top halves 4 and 6 of housing 2 to secure to jacks 8 and 12 within the housing 2. Each jack 8, 12 is conventional and includes eight formed wire contacts 7. Each of the formed wire contacts is crimped to a separate wire 50–64. Each of a plurality of wires 50–64 connect a formed wire contact 7 on jack 8 with a corresponding formed wire contact (not shown) on jack 12. Each of the wires 50–64 is secured within one of the wire retaining slots 40 and at a point along its length.

The jacks 8 and 12 are oriented in back-to-back alignment and are rotated 180° relative to one another along a central longitudinal axis of the adapter housing.

Figure 7:
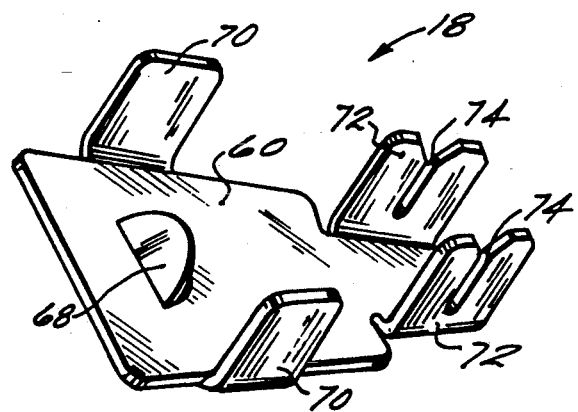
FIG. 7 shows a perspective view of a contact pad.

An electrically conductive contact pad 18 is mounted on each relief surface 38. As shown in FIG. 7, the pad 18 includes a body 66, a contact tab 68, a first pair of retention tabs 70, and a second pair of retention tabs 72. The second pair of retention tabs 72 each define insulation displacement slots 74. The contact tabs 68 facilitate positioning and securing alligator clips or other testing hardware to the pad 18. The pair of retention tabs 70 are inserted into retaining slots 44 on the bottom half 4 of housing 2. The pair of retention tabs 72 are inserted into retaining slots 42 on the bottom half 4 of housing 2. As the contact pads 18 are seated the insulation displacement slots 74 displace insulation from wires 50–64 to establish electrical contact with each corresponding wire 50–64. The locations of each contact pad location is labeled on both sides of the adapter with the corresponding modular jack pin number. All test locations are accessible from either side of the adapter.

The dual insulation displacement contact between the contact pads and the wires of the adapter insure the electrical integrity of the pad to wire contact and provides strain relief for the wire termination at the pad. The wire retaining slots with the housing provide strain relief by providing an interference fit between the housing and the wires.

Direct, back-to-back modular jack wiring shown as the preferred embodiment allows for the elimination of intermediate connection points between jacks. The benefits of fewer connections and a direct uninterrupted transmission path between jacks include improved dependability and service life. Instead of four connections between formed wire contacts on each modular jack, the present invention requires only two. Connection reliability to the test pad is also improved where prior art adapters have splice connections with only a single IDC termination point per wire, elimination of the splice allows for dual IDC termination of each jack wire with each contact pad.

Figure 10:
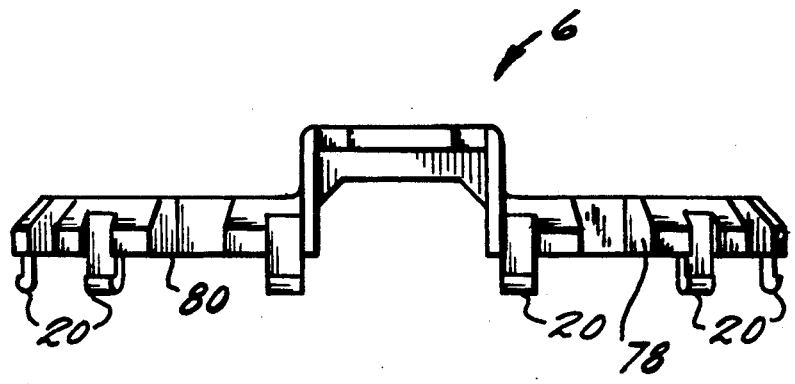
FIG. 10 shows a front elevational view of the top half of the adapter assembly shown in FIG. 2.
Figure 9:
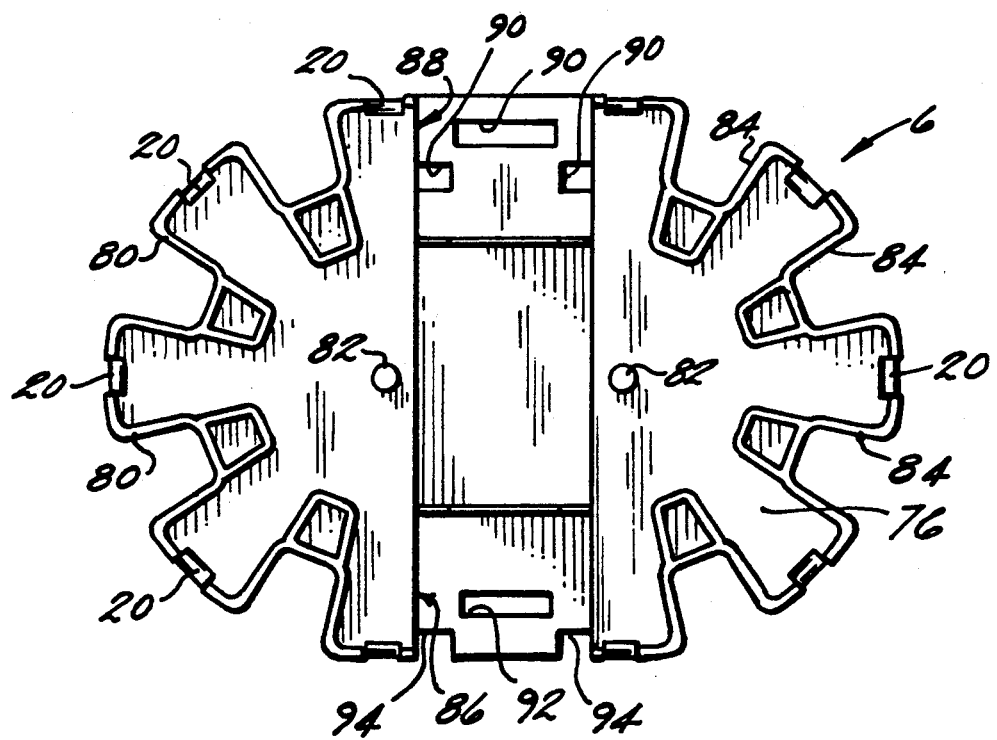
FIG. 9 shows a bottom view of the top half of the adapter assembly of FIG. 1.

FIGS. 9 and 10 show the top half of the housing 2. The top half 6 includes a top wall 76 and a side wall 78 extending downwardly from the top wall 76 to a bottom edge 80. A plurality of hooks 20 project downwardly from the sidewall 78. A pair of pins 82 project downwardly from the top wall 76. Circumferentially spaced apart recessed areas 84 are defined along the side wall 78. The top half 6 defines recesses 86 and 88 for receiving modular jacks 8 and 12, respectively, slots 90, 92 and notches 94 for securing jacks 8 and 12. Assembly of the adapter of the present invention is completed by installing and snaplocking the top half 6 on the assembly shown in FIGS. 6 and 8.

The test adapter of the present invention provides a number of advantages over prior art adapters. The adapter of the present invention provides two modular jacks secured within a housing and either one or both jacks may be accessed for testing. The jacks accept 2, 4, 6 or 8 wire keyed or nonkeyed plugs. The back-to-back orientation of the jacks allows the test hardware to establish contact with two outlets in an in-line test mode, e.g. test access is provided with network equipment fully connected and operational.

The manufacturing benefits of the present invention are manifold. Compared to prior art in-line adapters, the number of individual wire conductors requiring termination are reduced by half. This difference alone results in substantial reductions in the time, care and space required to assemble the unit. For example, all wire dressing and terminating operations are performed in a single plane, whereas space constraints of prior art in-line adapters require layered contact pads to maintain a coherent package. The radial contact pad configuration not only provides circuit access with the minimum possible interference with other test leads, but is also optimally configured for unencumbered wire harnessing during assembly.

Material costs are also lower than for prior in-line designs since no scrap wire is produced from cutting operations once wire conductors are dressed into place. In contrast with a continuous wire running between jack connectors that may be terminated anywhere along its length, sixteen individual wire leads from the two modular connectors each require a place-and-cut operation to allow for the varying distance between the jack and termination area. For instance, in FIG. 6 it may be noted that wire conductors 56 and 62 are terminated significantly closer to jack 8 than are conductors 50 and 58. Also, the two piece housing design of the present invention is clearly preferable to three piece housings required by the layered contact arrangement of prior art. The snap fit assembly of the housing members does not require secondary assembly operations or additional hardware.

The contact pads of the present invention each provide a contact tab extending outwardly from surface of the contact pad for positioning and securing alligator clips or other testing hardware to the pad.

The detachable double ended universal plug cord of the adapter of the present invention offers several distinct advantages over prior art adapters. First is product versatility; a detachable cord allows the adapter to be easily reconfigured for access to two modular line cords. Second is mechanical integrity; the strain relief provided by a modular plug is optimally configured for modular line cords and is clearly superior to trapping the cord between two halves of a housing. Third is product longevity; a worn or damaged cord may be easily replaced and does not require that the entire unit be discarded. Also, reducing the number of mating cycles performed on the integral connectors increases service life. Finally, the detachable cord improves portability and reduces cost by alleviating the need for metallic or plastic clips. When mated to both jacks in a loop configuration, the adapter is easily attached to a tool pouch or clothing when not in use.

While preferred embodiments have been shown and described, various modifications and substitutions may be made thereto without departing from the spirit and scope of the invention. Accordingly, it is to be understood that the present invention has been described by way of illustrations and limitations.

What is claimed is:

1. A modular test adapter, comprising:
   a pair of modular communications jacks, each of said jacks including a plurality of wire termination pins and having a plug opening for receiving a modular communications plug;
   a plurality of electrically isolated test circuits, each test circuit comprising an electrical contact pad in electrical connection with one of the termination pins of one of the jacks and with one of the termination pins of the other jack;
   housing means for securing the jacks and test circuits in a fixed relative spacial arrangement and for partially covering said jacks and test circuits while allowing access to said plug openings and said contact pads, said housing means comprising a top surface, an opposed bottom surface, a pair of opposed side surfaces between the top and bottom surfaces and a pair of curved end surfaces between the top and bottom surfaces and the side surfaces, wherein the side surfaces define openings for providing access to the plug openings of the jacks, the housing having a plurality of radially oriented circumferentially spaced apart recesses along the curved end surfaces and each of the contact pads being secured within one of the recesses to minimize interference with test leads attachable to the contact pads and to optimize ease of assembly.

2. The adapter of claim 1, wherein the housing means comprise an electrically insulative material.

3. The adapter of claim 1, wherein the housing comprises a top half and a bottom half and the top half and bottom half are secured in snap locking engagement with each other.

4. The adapter of claim 1, wherein the modular jacks each include mounting tabs, the housing defines recesses for receiving the modular telecommunications jacks and defines retaining slots and retaining notches for receiving and mounting tabs to secure the jacks within the recesses.

5. The adapter of claim 1, wherein the oppositely oriented plug openings of the two modular communication jacks allow in-line access to the circuits of a telecommunication network.

6. The adapter of claim 1, wherein the test circuits further comprise wires for electrically connecting the contact pads to the wire termination pins and the housing means defines wire retaining slots for securing the wires to the housing means.

7. The adapter of claim 1, wherein each of the contact pads comprises a wedge shaped sheet of an electrically conductive material, said sheet having opposed planar top and bottom surfaces and including a raised contact bump protruding from one of the planar surfaces of the pad.

8. The adapter of claim 6, wherein the contact pads include mounting tabs, the mounting tabs define insulation displacement slots, the housing means define retaining slots for receiving the mounting tabs of the contact pads and said retaining slots and mounting tabs are oriented so that the insulation displacement slots on the tabs establish electrical connections between the pads and the wires when the tabs are received by the retaining slots.

9. The adapter of claim 8, wherein each contact pad includes two opposed mounting tabs each defining an insulation displacement slot and wherein the two insulation displacement slots provide strain relief for the electrical connection between the pad and the wire and insure the electrical integrity of the connection.

10. The adapter of claim 1, further comprising a double ended modular plug cord, said cord comprising a pair of modular plugs electrically connected by an electrical cable, wherein one of said modular plugs is received within the plug opening of one of the modular jacks.

11. The adapter of claim 10, wherein the other plug of the double ended plug cord is received within the plug opening of the other modular jack and provides means for carrying said adapter.

12. A modular test adapter, comprising:
    a pair of modular communications jacks, each of said jacks including a plurality of wire termination pins and having a plug opening for receiving a modular communication plug; said jack being oriented in a back-to-back relationship do that one of said plug openings is forwardly facing and one of said plug openings is rearwardly facing;
    a plurality of electrically isolated test circuits, each test circuit comprising an electrical contact pad in electrical connection with one of the termination pins of one of the jacks and with one of the termination pins of the other jack; and
    housing means for securing the jacks and test circuits in a fixed relative spacial arrangement and for partially covering said jacks and test circuits while allowing access to said plug openings and said contact pads, said housing means comprising;
    a central channel portion, having opposed top and bottom surfaces extending longitudinally between said jacks, and a pair of opposed side portions, each extending laterally from the central channel portion to a respective sidewall and each having a respective top surface stepped downwardly from the top surface of the center portion, and having a respective bottom surface stepped upwardly from the bottom surface of the center portion, wherein each of said side portions define in plurality of spaced apart recesses along its respective sidewall and wherein said contact pads are secured within said recesses.

* * * * *